US011052352B2

(12) United States Patent
Li et al.

(10) Patent No.: US 11,052,352 B2
(45) Date of Patent: Jul. 6, 2021

(54) POLYVINYLIDENE FLUORIDE/ULTRA-HIGH MOLECULAR WEIGHT POLYETHYLENE BLEND MICROPOROUS MEMBRANE AND PREPARATION METHOD THEREOF

(71) Applicant: Tianjin Polytechnic University, Tianjin (CN)

(72) Inventors: Nana Li, Tianjin (CN); Xiaodong Zhang, Tianjin (CN); Weiwei Yin, Tianjin (CN); Dan Guo, Tianjin (CN); Changfa Xiao, Tianjin (CN)

(73) Assignee: Tianjin Polytechnic University, Tianjin (CN)

( * ) Notice: Subject to any disclaimer, the term of this patent is extended or adjusted under 35 U.S.C. 154(b) by 0 days.

(21) Appl. No.: 16/215,629

(22) Filed: Dec. 10, 2018

(65) Prior Publication Data

US 2019/0105611 A1 Apr. 11, 2019

(30) Foreign Application Priority Data

Aug. 6, 2018 (CN) .......................... 201810884817.8

(51) Int. Cl.
*B01D 67/00* (2006.01)
*B01D 69/02* (2006.01)
(Continued)

(52) U.S. Cl.
CPC ....... *B01D 67/0013* (2013.01); *B01D 67/003* (2013.01); *B01D 67/009* (2013.01);
(Continued)

(58) Field of Classification Search
CPC .... B01D 67/0013; B01D 71/26; B01D 71/34; B01D 2323/08; B01D 2323/42
See application file for complete search history.

(56) References Cited

U.S. PATENT DOCUMENTS 3,635,937 A 1/1972 Bauer
3,676,523 A 7/1972 Mason
(Continued)

FOREIGN PATENT DOCUMENTS

CN 101695634 A * 4/2010
CN 102007136 A 4/2011
(Continued)

OTHER PUBLICATIONS

Shulin An et al—CN-101695634-A machine translation—2010 (Year: 2010).*
(Continued)

*Primary Examiner* — Bradley R Spies

(57) ABSTRACT

Disclosed is a polyvinylidene fluoride/ultra-high molecular weight polyethylene blend microporous membrane and preparation method thereof, which belongs to the field of microporous membrane. The blend microporous membrane has good hydrophobicity, mechanical properties and permeability. The preparation method includes: preparing a suspension by polyvinylidene fluoride, ultra-high molecular weight polyethylene, antioxidant and diluent; then feeding the obtained suspension into a twin-screw extruder, and the cast membrane gel extruded from the outlet is directly injected into a metal mold for injection molding; the mold temperature and the outlet temperature of the extruder are the same, and the cavity surface of the mold has micro-prism array structure; then cooling the mold in aqueous medium to obtain a nascent gel membrane; drying the obtained nascent gel membrane in a freeze dryer after removal of the diluents by extraction. The prepared membrane can be used in the membrane separation technology such as membrane distillation.

15 Claims, 6 Drawing Sheets

(51) Int. Cl.
  *B01D 71/26* (2006.01)
  *B01D 71/34* (2006.01)
  *B29C 45/00* (2006.01)
  *B29C 45/73* (2006.01)
  *B29K 27/00* (2006.01)
  *B29L 31/00* (2006.01)
  *C23C 14/12* (2006.01)
  *C23C 14/35* (2006.01)
  *B01D 71/76* (2006.01)
  *B29C 45/26* (2006.01)
  *B01D 61/36* (2006.01)

(52) U.S. Cl.
  CPC ..... *B01D 67/0088* (2013.01); *B01D 67/0095* (2013.01); *B01D 69/02* (2013.01); *B01D 71/26* (2013.01); *B01D 71/34* (2013.01); *B01D 71/76* (2013.01); *B29C 45/0001* (2013.01); *B29C 45/263* (2013.01); *B29C 45/73* (2013.01); *C23C 14/12* (2013.01); *C23C 14/35* (2013.01); *B01D 61/364* (2013.01); *B01D 2323/08* (2013.01); *B01D 2323/12* (2013.01); *B01D 2323/18* (2013.01); *B01D 2323/35* (2013.01); *B01D 2323/42* (2013.01); *B01D 2325/08* (2013.01); *B01D 2325/24* (2013.01); *B01D 2325/34* (2013.01); *B01D 2325/38* (2013.01); *B29K 2027/16* (2013.01); *B29L 2031/755* (2013.01)

(56) References Cited

U.S. PATENT DOCUMENTS

| | | | |
|---|---|---|---|
| 3,906,053 A | 9/1975 | Lanier | |
| 6,184,428 B1 | 2/2001 | Zahoor et al. | |
| 2006/0149053 A1* | 7/2006 | Antrim | C08B 30/18 536/123 |
| 2007/0065655 A1* | 3/2007 | Floyd | C08J 5/18 428/317.9 |

FOREIGN PATENT DOCUMENTS

| | | | |
|---|---|---|---|
| CN | 104474923 A | | 4/2015 |
| CN | 104803818 A | | 7/2015 |
| CN | 106492645 A | * | 3/2017 |
| DE | 1443927 | | 12/1968 |
| EP | 0611743 A2 | | 8/1994 |
| WO | 99/02472 | | 1/1999 |
| WO | 2008004986 A1 | | 1/2008 |

OTHER PUBLICATIONS

Xiao Changfa—CN-106492645-A—2017 (Year: 2017).*
Effect of stretching on structure and properties of polyethylene hollow fiber membranes made by melt-spinning and stretching process, Aug. 4, 2008, Zhen-yu Xi; You-Yi Xu; Li-Ping Zhu; Chun-Hui Du; Bao-ku Zhu.
Shear-induced crystallization morphology and mechanical property of high density polyethylene in micro-injection molding, Aug. 5, 2014, Xiang Lin; Fin Caton-Rose; Dongyun Ren; Kuisheng Wang; Phil Coates.
A "room-temperature" injection molding/particulate leaching approach for fabrication of biodegradable three-dimensional porous scaffolds, Aug. 11, 2005, Linbo Wu; Dianying Jing; Jiandong Ding.
Investigation of optical and microstructural properties of RF magnetron sputtered PTFE membranes for hydrophobic applications, May 26, 2016, S. Tripathi a; S. Maidul Haque a; K. Divakar Rao a; Rajnarayan De a; T. Shripathi b; J. Deshpande b; V. Ganesan b; N.K. Sahoo.
Novel olefin polymerization catalysts based on iron and cobal, Jan. 1, 1998, George J. P. Britovsek; Vernon C. Gibson; Brian S. Kimberley; Peter J. Maddox; Stuart J. McTavish; Gregory A. Solan;Andrew J. P. White; and David J. Williams.
Iron-Based Catalysts with Exceptionally High Activities and Selectivities for Oligomerization of Ethylene to Linear r-Olefins, Jul. 7, 1998, Brooke L. Small; Maurice Brookhart.

* cited by examiner

```
┌─────────────────────────────────────────────────────────────────────┐  S1
│ drying ultra-high molecular weight polyethylene at 60°C for 2-3 h,  │
│ and polyvinylidene fluoride at 90°C for 2-3 h                        │
└─────────────────────────────────────────────────────────────────────┘
                                   │
                                   ▼                                      S2
┌─────────────────────────────────────────────────────────────────────┐
│ mixing the polyvinylidene fluoride and the ultra-high molecular     │
│ weight polyethylene prepared in S1 together with antioxidants and   │
│ diluents, then stirring for 1-2 h at normal temperature to obtain   │
│ a uniformly dispersed suspension                                     │
└─────────────────────────────────────────────────────────────────────┘
                                   │
                                   ▼                                      S3
┌─────────────────────────────────────────────────────────────────────┐
│ feeding the suspension prepared in S2 into a twin-screw extruder    │
│ with 6 heating zones heated individually, wherein the temperature   │
│ of each heating zone from 1 to 6 are, in order, 130°C, 140°C,       │
│ 160°C, 175°C, 190-220°C, 200-230°C, and the outlet temperature      │
│ is 200-250°C; and injecting the cast membrane gel extruded from     │
│ the outlet directly into a metal mold for injection molding; the    │
│ mold temperature and the outlet temperature of the twin-screw       │
│ extruder are the same, and the cavity surface of the mold has       │
│ micro-prism array structure; and then cooling the mold with the     │
│ cast membrane gel in aqueous medium of 0-100°C to obtain a          │
│ nascent gel membrane                                                 │
└─────────────────────────────────────────────────────────────────────┘
                                   │
                                   ▼                                      S4
┌─────────────────────────────────────────────────────────────────────┐
│ drying the nascent gel membrane prepared in S3 in a freeze dryer    │
│ for more than 12 h after removal of the diluent by extraction, to   │
│ obtain a polyvinylidene fluoride/ultra-high molecular weight         │
│ polyethylene dry blend microporous membrane                          │
└─────────────────────────────────────────────────────────────────────┘
                                   │
                                   ▼                                      S5
┌─────────────────────────────────────────────────────────────────────┐
│ using the dry blend microporous membrane prepared in S4 as a        │
│ substrate to perform surface modification treatment on it by        │
│ magnetron sputtering technology                                      │
└─────────────────────────────────────────────────────────────────────┘
```

FIG.2

POLYVINYLIDENE FLUORIDE/ULTRA-HIGH MOLECULAR WEIGHT POLYETHYLENE BLEND MICROPOROUS MEMBRANE AND PREPARATION METHOD THEREOF

CROSS REFERENCE TO RELATED APPLICATION

This application claims priority of Chinese Application No. 201810884817.8 filed on 2018 Aug. 6 and entitled "Polyvinylidene Fluoride/Ultra-high Molecular Weight Polyethylene Blend Microporous Membrane and Preparation Method Thereof".

TECHNICAL FIELD

The present disclosure relates to the microporous membrane technology, especially relates to a blend microporous membrane and preparation method thereof, specifically relates to a polyvinylidene fluoride/ultra-high molecular weight polyethylene blend microporous membrane and preparation method thereof.

BACKGROUND

Polyvinylidene fluoride (PVDF) is a highly hydrophobic material with extremely low surface energy, good chemical stability, heat resistance and mechanical stability. But for the polyvinylidene fluoride membrane it is difficult to improve the hydrophobicity and mechanical property simultaneously, and it also needs further improvement to prolong service life and meet process requirements of hydrophobic membrane such as membrane distillation, membrane extraction and the like.

At present, there are mainly three methods for preparing hydrophobic microporous membranes including melting method, wet phase inversion method and thermally induced phase separation method. Compared with melting method, the membrane prepared by thermally induced phase separation method performs better pore-forming effect, and better connectivity of the pore structure after diluents extraction; meanwhile, the casting solution system performs better fluidity under the effect of diluents. Xi et al. prepared microporous polyethylene (PE) hollow fiber membranes by melt-spinning and stretching (MS-S) process (Xi Z Y, Xu Y Y, Zhu L P, et al. Effect of stretching on structure and properties of polyethylene hollow fiber membranes made by melt-spinning and stretching process[J]. *Polymers for Advanced Technologies*, 2008, 19(11):1616-1622). In addition, preparing membrane process by the thermally induced phase separation method is a phase separation caused by elapsing heat of the system, relative to the wet phase conversion method, it is easier to control the material exchange (A Chinese patent application of CN104474923A discloses a thermally induced phase separation method for preparing polyvinylidene fluoride/polyvinyl alcohol blend membrane).

The micro-injection molding is a polymer micro-structure manufacturing technology, which uses the confinement of template itself and the interaction between polymers to adjust the surface topography, shape, structure, size, arrangement and the like, and has the advantages of being simple in manufacturing process, low in production cost, hardly affected by the restriction geometry of plastic part and easy to realize large-scale automatic production and the like. Currently the micro-injection molding is mainly used in optical communication, medical technology, biotechnology, sensors, transmission devices, micro-optical devices and the like. Research hotspots are mainly concentrated in the micro-injection molding device, miniature mold manufacturing and processing, micro-molding material selecting, process control in the micro-molding process, micro-molding theory and numerical simulation analysis and micro article quality characterization and the like, while it is rarely used in the preparation of porous membrane.

It has been reported that some studies used melting method combining micro-injection molding to prepare micro-structure polymer. Lin et al. studied the behavior of melt flow induced crystallization and its influence on the mechanical property of high-density polyethylene in the micro-injection molding process after high density polyethylene melted (Lin X, Caton-Rose F, Ren D, et al. Shear-induced crystallization morphology and mechanical property of high density polyethylene in micro-injection molding [J]. *Journal of Polymer Research*, 2013, 20(4):1-12.). Some studies used wet phase inversion method combining micro-injection molding to prepare micro-structure articles. For example, Wu et al. first proposed a "room-temperature" injection molding/particulate leaching approach for fabrication of biodegradable three-dimensional porous scaffolds (Wu L, Jing D, Ding J. A "room-temperature" injection molding/particulate leaching approach for fabrication of biodegradable three-dimensional porous scaffolds[J]. *Biomaterials*, 2006, 27(2):185-191.).

The magnetron sputtering is one of physical vapor deposition technology and has the advantages of being simple in equipment, easy to control, large in coating area, high in adhesive force and the like. Tripathi et al. used radio frequency magnetron sputtering method to deposit uniform ultra-thin polytetrafluoroethylene sputter membrane on glass substrate using polytetrafluoroethylene as a target (Tripathi S, Hague S M, Rao K D, et al. Investigation of optical and microstructural properties of RF magnetron sputtered PTFE membranes for hydrophobic applications[J]. *Applied Surface Science*, 2016, 385:289-298.). Although the magnetic sputtering technology is maturely applied to material surface modification, it is very rare to combine magnetron sputtering technology with micro-injection molding in the field of micro-hole membrane.

SUMMARY OF THE INVENTION

The present disclosure provides a polyvinylidene fluoride/ultra-high molecular weight polyethylene blend microporous membrane and preparation method thereof, provides a blend microporous membrane with good hydrophobicity, mechanical property and permeability, which can be used in the field of membrane separation such as membrane distillation and the like.

The present disclosure provides a preparation method of a polyvinylidene fluoride/ultra-high molecular weight polyethylene blend microporous membrane (hereafter also can be referred as a blend microporous membrane), including the following steps:

S1: drying ultra-high molecular weight polyethylene at 60° C. for 2-3 h, and polyvinylidene fluoride (PVDF) at 90° C. for 2-3 h;

S2: mixing the polyvinylidene fluoride and the ultra-high molecular weight polyethylene prepared in S1 together with an antioxidant and a diluent system, then stirring for 1-2 h at normal temperature to obtain a uniformly dispersed suspension;

S3: feeding the suspension prepared in S2 into a twin-screw extruder with 6 heating zones heated individually, wherein the temperature of each heating zone from 1 to 6 are, in order, 130° C., 140° C., 160° C., 175° C., 190-220° C., 200-230° C., and the outlet temperature is 200-250° C.; injecting a cast membrane gel extruded from the outlet directly into a metal mold for injection molding; the mold temperature and the outlet temperature of the twin-screw extruder are the same, and the cavity surface of the mold has a micro-prism array structure; and then cooling the mold injected with the cast membrane gel in aqueous medium of 0-100° C. to obtain a nascent gel membrane;

S4: drying the nascent gel membrane prepared in S3 in a freeze dryer for more than 12 h after removal of the diluent by extraction to obtain a polyvinylidene fluoride/ultra-high molecular weight polyethylene dry blend microporous membrane (hereafter also can be referred as a dry microporous membrane).

In the further embodiments, the microstructure cycle size of the micro-prism array structure is 20-200 μm; further is 50-100 μm.

In the further embodiments, step S5 is included after step S4: using the dry blend microporous membrane prepared in S4 as a substrate to perform surface modification treatment on it by magnetron sputtering technology.

In the further embodiments, the magnetron sputtering technology is a radio frequency magnetron sputtering; the target used above is selected from polytetrafluoroethylene, fluorinated ethylene propylene, polyvinylidene fluoride or graphite; the sputtering power is 100-200 w, the sputtering time is 30 s-30 min and the sputtering pressure is 0.1-1 Pa.

In the further embodiments, the prepared blend microporous membrane has a thickness of 0.30-1.50mm.

In the further embodiments, the diluent is a mixture of dibutyl phthalate and paraffinic oil.

The nascent gel membrane prepared in step S3 is subjected to four extractions before dried in a freeze dryer, including: a first extraction by immersing in absolute ethanol for 12-24 hours; a second extraction by immersing in 120# gasoline for 12-24 hours; a third extraction by immersing in absolute ethanol for 6-12 hours; and a fourth extraction by immersing in deionized water for 24-48 hours.

In the further embodiments, the prepared blend microporous membrane is used in membrane separation process; further, the membrane separation process may be selected from membrane distillation, membrane extraction, or gas membrane separation.

In the further embodiments, the blend microporous membrane is prepared by the following components:

| | |
|---|---|
| polyvinylidene fluoride | 10.00-30.00 wt % |
| ultra-high molecular weight polyethylene | 0.50-10.00 wt % |
| paraffinic oil | 40 wt % |
| dibutyl phthalate | 19.00-49.45 wt % |
| antioxidant | 0.05-1.00 wt %; | the sum of the components is 100 wt %.

In the further embodiments, the antioxidant is beta-(3,5-di-tert-butyl-4-hydroxy phenyl) propionic acid octadecanol ester and the mass ratio to the ultra-high molecular weight polyethylene is 1:10.

In the further embodiments, the prepared blend microporous membrane has a composite surface of micro prism array structure and porous structure, and the porous structure comprises a pore structure formed after extraction of diluents and an interface pore structure formed between polyvinylidene fluoride and ultra-high molecular weight polyethylene.

For the other, the present disclosure provides a polyvinylidene fluoride/ultra-high molecular weight polyethylene blend microporous membrane prepared by anyone of the above-described preparation methods.

In the further embodiments, the blend microporous membrane is prepared by the following components:

| | |
|---|---|
| polyvinylidene fluoride | 10.00-30.00 wt % |
| ultra-high molecular weight polyethylene | 0.50-10.00 wt % |
| paraffinic oil | 40 wt % |
| dibutyl phthalate | 19.00-49.45 wt % |
| antioxidant | 0.05-1.00 wt %; | the sum of the components is 100 wt %.

In the further embodiments, the suitable antioxidant is beta-(3, 5-di-tert-butyl-4-hydroxy phenyl) propionic acid octadecanol ester and the mass ratio to the ultra-high molecular weight polyethylene is 1:10.

In the further embodiments, the nascent gel membrane prepared in step S3 is subjected to four extractions before dried in a freeze dryer, including: a first extraction by immersing in absolute ethanol for 12-24 hours; a second extraction by immersing in 120# gasoline for 12-24 hours; a third extraction by immersing in absolute ethanol for 6-12 hours; and a fourth extraction by immersing in deionized water for 24-48 hours.

In the further embodiments, the blend microporous membrane has a thickness of 0.30-1.50 mm.

In the further embodiments, the microstructure cycle size of the micro-prism array structure is 20-200 μm, further is 50-100 μm.

In the further embodiments, step S5 is included after step S4: using the dry blend microporous membrane prepared in S4 as a substrate to perform surface modification treatment on it by magnetron sputtering technology.

In the further embodiments, the magnetron sputtering technology is a radio frequency magnetron sputtering; the target used above is selected from polytetrafluoroethylene, fluorinated ethylene propylene, polyvinylidene fluoride or graphite; the sputtering power is 100-200 w, the sputtering time is 30 s-30 min and the sputtering pressure is 0.1-1 Pa.

In the further embodiments, the blend microporous membrane is used in membrane separation process; further, the membrane separation process may be selected from membrane distillation, membrane extraction, or gas membrane separation.

In the further embodiments, the blend microporous membrane has a composite surface of micro prism array structure and porous structure, and the porous structure comprises a pore structure formed after extraction of two diluents and an interface pore structure formed between two polymers.

Compared with prior arts, the beneficial effects of the present disclosure are:

(1) The present disclosure provides a preparation method of a polyvinylidene fluoride/ultra-high molecular weight polyethylene blend microporous membrane, which combines micro-injection molding with thermally induced phase separation method to form a membrane. The prepared membrane has composite surface structure composed of micro array structure and porous structure, which increases the surface roughness of the membrane and improves the hydrophobicity on the basis of maintaining its good mechanical strength.

(2) In the preparation method of the blend microporous membrane provided by the present disclosure, ultra-high molecular weight polyethylene in the membrane is presented in network connection structure, which increases the connection among polyvinylidene fluoride crystals, and enhances the mechanical strength of the membrane.

(3) In the preparation method of the blend microporous membrane provided by the present disclosure, the dry microporous membrane is subjected to surface modification treatment by magnetron sputtering technology, and nanoparticles of low surface energy are deposited on the surface of the dry microporous membrane. A micro-nano composite structure is formed by the deposition of nanoparticles on the microarray structure of the microporous membrane and the surface energy of the membrane reduces, further, the hydrophobicity of the membrane gets improved.

(4) In the preparation method of the blended microporous membrane provided by the present disclosure, a double-diluents and double-polymers system is used, and there is a variety of pore structures in the interior of the membrane. The pore structure formed after extraction of two diluents and the interface pore structure formed between two polymers are exist simultaneously, which further improves the porosity and connectivity of membrane pore.

BRIEF DESCRIPTION OF FIGURES

In order to clearly illustrate the technical solutions in the embodiments of the present disclosure or the prior art, the drawings used in the description of the embodiments or the prior art are briefly described, obviously, the drawings described below are merely some embodiments of the present disclosure, persons skilled in the art, without paying a creative effort, may further obtain other drawings according to these drawings.

FIG. 2 is a schematic flowchart of the method for preparing a polyvinylidene fluoride/ultra-high molecular weight polyethylene blend microporous membrane according to another embodiment of the present disclosure;

DETAILED DESCRIPTION

The technical solutions in the embodiments of the present disclosure are clearly and completely described in the following with reference to the drawings in the embodiments, it is obvious that the described embodiments are only parts of the embodiments of the present disclosure, rather than all embodiments. All other embodiments prepared by those skilled in the art based on the embodiments of the present disclosure, without creative efforts, are within the scope of the present disclosure.

The membrane distillation is a new membrane separation process emerged in recent years. The process can make full use of factory heat or solar energy, and is low in cost, simple in equipments and easy to automate. The suitable membrane materials need to meet the requirements of hydrophobicity and porosity at least. The hydrophobicity of the polyvinylidene fluoride membrane can be further improved to meet the requirements of process such as membrane distillation.

The inventors of the present disclosure found that PVDF membrane is easily broken during using and cleaning, and has low mechanical strength. In the prior art, it is difficult to enhance the mechanical strength while improving the hydrophobicity of the PVDF membrane.

An embodiment of the present disclosure provides a preparation method of a polyvinylidene fluoride membrane/ultra-high molecular weight polyethylene blend microporous membrane, which combines micro-injection molding with thermally induced phase separation method. The prepared microporous membrane gets improved in hydrophobicity, mechanical property and permeability simultaneously. Through the preparation method by the embodiment of the present disclosure, the hydrophobicity and permeability of the membrane are get improved on the basics of maintaining its mechanical strength, and it is durable and tolerance to cleaning The microporous membrane prepared by the embodiment of the present disclosure can be used in the field of hydrophobic membrane, specifically membrane separation technology, such as membrane distillation, membrane extraction, gas membrane separation and the like.

Further, the microporous membrane prepared by the embodiment of the present disclosure can be used in the field of membrane distillation. Membrane distillation (MD) is a separation process which combines membrane technology with distillation process. The membrane material used for membrane distillation should meet the requirements of hydrophobicity and porosity at least. In addition, sufficient mechanical strength and good thermal stability are also necessary for the membrane material for MD.

Figure 1:
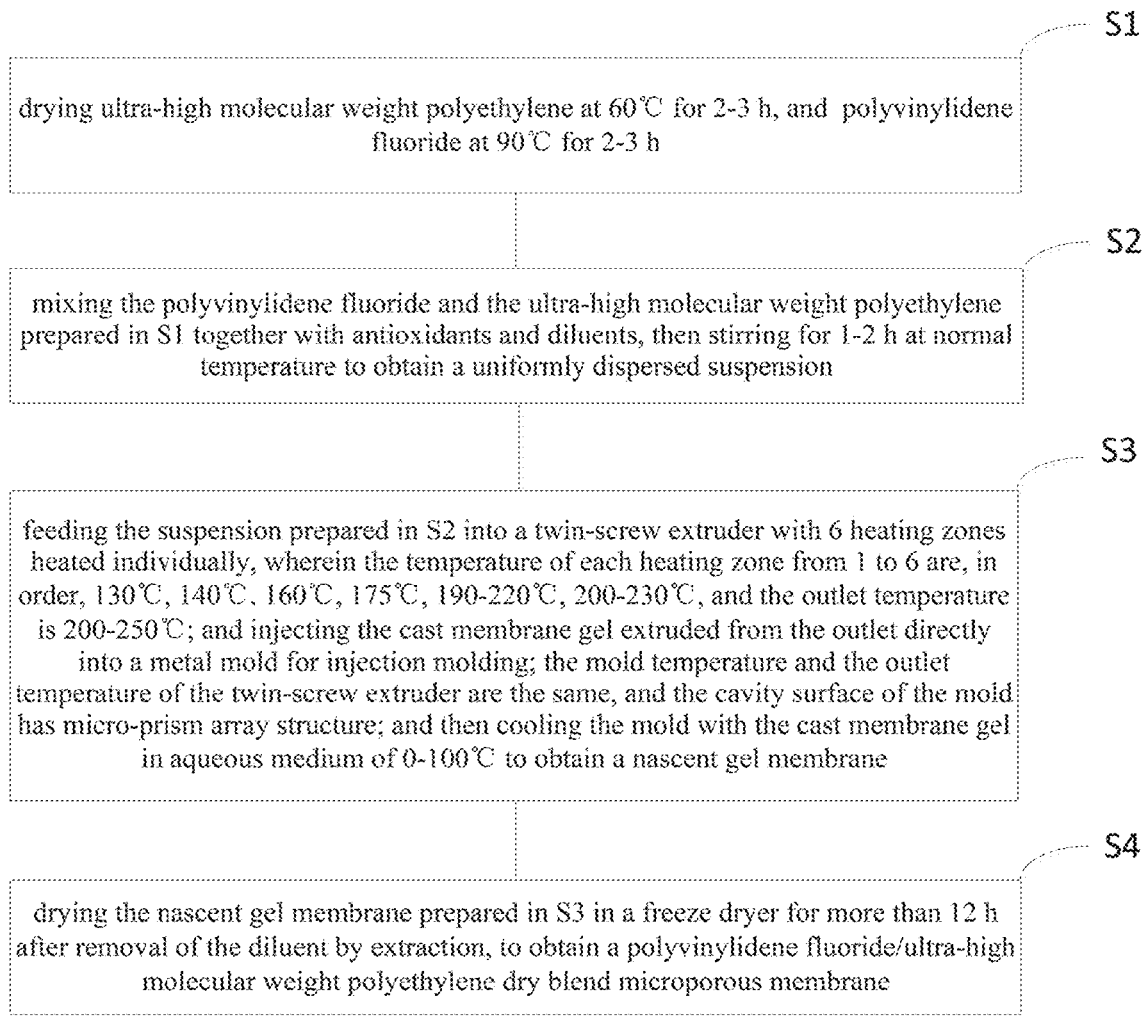
FIG. 1 is a schematic flowchart of the method for preparing a polyvinylidene fluoride/ultra-high molecular weight polyethylene blend microporous membrane according to an embodiment of the present disclosure.

Referring to FIG. 1, the preparation method may specifically include the following steps:

S1: drying an ultra-high molecular weight polyethylenes at 60° C. for 2-3 h, and a polyvinylidene fluoride (PVDF) at 90° C. for 2-3 h;

S2: mixing the polyvinylidene fluoride and ultra-high molecular weight polyethylene prepared in S1 together with an antioxidant and a diluent system, then stirring for 1-2 hours at normal temperature to obtain a uniformly dispersed suspension;

S3: feeding the suspension prepared in S2 into a twin-screw extruder provided with 6 heating zones heated individually, wherein the temperature of each heating zone from 1 to 6 are, in order, 130° C., 140° C., 160° C., 175° C., 190-220° C., 200-230° C., and the outlet temperature is 200-250° C.; and injecting the cast membrane gel extruded from the outlet directly into a metal mold for injection molding; the mold temperature and the outlet temperature of the twin-screw extruder are the same, and the cavity surface of the mold has a micro-prism array structure; and then cooling the mold injected with the cast membrane gel in aqueous medium of 0-100° C. to obtain a nascent gel membrane;

S4: drying the nascent gel membrane prepared in S3 in a freeze dryer for more than 12 hours after removal of the diluents by extraction, to obtain a polyvinylidene fluoride/ultra-high molecular weight polyethylene dry blend microporous membrane.

In some embodiments, the outlet temperature of the twin-screw extruder can range from 220-240° C. The outlet temperature and mold temperature can change the viscosity of the cast membrane gel, so as to affect the replication accuracy of the micro-injection. Meanwhile, temperature changes will affect the movement and aggregation of the diluent during the phase separation process, and affect the roughness and pore structure of the membrane surface, so as to affect the hydrophobicity of the membrane.

The mold temperature is the same as the outlet temperature of the twin-screw extruder, that is, in step S3, the cast membrane gel extruded from the outlet is directly injected into the high temperature mold of 220-240° C. for injection molding.

In some embodiments, the cavity surface of suitable mold is provided with micro-prism array structure, and the microstructure cycle size of which is 20-200 μm. Further, the microstructure cycle size may be 50-150 μm, 50-100 μm and 50-80 μm. For example, it may be 40 μm, 50 μm, 60 μm, 80 μm, 100 μm, 120 μm and the like. The microstructure cycle size is the structural period of the micro-prism array structure. The microstructure cycle size of the mold will affect the surface roughness, so as to affect the hydrophobicity of the membrane.

In some embodiments, in step S4, the dry microporous membrane prepared in step S3 is subjected to extraction treatment, such as solvent extraction to remove the diluents, and soaking by ultrafiltration water to remove the solvent, and then placed into a freezer dryer for more than 12 h, for example 12-23 h, such as 12, 16, 18, 22 h, to obtain the dry microporous membrane.

In some embodiments, a dual-diluents system and dual-polymers system are employed. The diluent is a mixture of paraffin oil and dibutyl phthalate. The extraction in step S4 is divided into four extractions: a first extraction of immersing in absolute ethanol for 12-24 hours to remove the dibutyl phthalate; a second extraction of immersing in 120# gasoline for 12-24 hours to remove the paraffin oil; a third extraction out of immersing in absolute ethanol for 6-12 hours to remove the 120# gasoline; and a fourth extraction of immersing in deionized water for 24-48 hours to remove absolute ethanol.

In some embodiments, the blended microporous membrane is prepared by the following components:

| | |
|---|---|
| polyvinylidene fluoride | 10.00-30.00 wt % |
| ultra-high molecular weight polyethylene | 0.50-10.00 wt % |
| paraffinic oil | 40 wt % |
| dibutyl phthalate | 19.00-49.45 wt % |
| antioxidant | 0.05-1.00 wt %; | the sum of the components is 100 wt %.

The blend microporous membrane prepared by the embodiment of the present disclosure adopts a double-diluents and double-polymers system. The pore structures formed after extraction of two diluents and the interface pore structures formed between two polymers are exist simultaneously, which further improves the porosity and connectivity of membrane pore.

The blended microporous membrane prepared by the embodiment of the present disclosure adopts double diluents of a mixture of paraffin oil and dibutyl phthalate, in which, both polyvinylidene fluoride and ultra-high molecular weight polyethylene have good fluidity, meanwhile, the synergistic effect of various pore structures improves permeability, mechanical strength and the like of the microporous membrane.

In some embodiments, the antioxidant can be octadecyl β-(3,5-di-tert-butyl-4-hydroxyphenyl) propanoate. In the embodiment of the present disclosure, a single antioxidant system is used, and the mass fraction of the antioxidant in the total components (total components=PVDF+UHMWPE+diluents+antioxidant) is 0.05-1.00 wt %, wherein, the mass ratio of the antioxidant to ultra-high molecular weight polyethylene can be 1:8-10, specifically 1:10.

The inventors of the present disclosure have proposed an enhanced ultra-high molecular weight polyethylene and polyvinylidene fluoride binary blended membrane and preparation method thereof in a patent application CN106492645A. In the method, the inventors prepared a polyvinylidene fluoride/ultra-high molecular weight polyethylene blended membrane by combining thermally induced phase separation method with melting method, wherein the polyvinylidene fluoride does not react with diluent at high temperature, but directly melts. While in the present disclosure, the inventors proposes a new method for preparing a blend microporous membrane, which uses a mixed diluent to melt polyvinylidene fluoride and ultra-high molecular weight polyethylene separately, and combines the thermally induced phase separation method with the micro-injection molding.

The micro-injection molding is a polymer microstructure manufacturing technology, which can adjust the surface topography, shape, structure, size, arrangement and the like. The inventors of the present application have found that, in the prior art, the micro-injection technology is generally combined with the melting method or the wet phase inversion method. However, there are few studies or none to combine the micro-injection technology with the thermally induced phase separation method (TIPS method) not only in the field of microporous membrane, but also in other fields. The reason may be that the molding process of the thermally induced phase separation method and that of the micro-injection molding differ greatly. How to give a consideration to both of the pore-forming process by thermally induced phase separation and the microstructure of micro-injection technology, hinders the combination of thermally induced phase separation and micro-injection technology in preparing micro-structured surface porous membrane.

Both thermally induced phase separation and micro-injection technology involve high temperature dissolution and low temperature molding, however, each process has its strict requirements, and the heating temperature, cooling temperature, pressure and the like are all different. Combining the two processes needs to consider the effect of one parameter on both of them at the same time. According to the preparation method of the present disclosure, the polymer of polyvinylidene fluoride and the ultra-high molecular weight polyethylene are dried separately, and then stirred with diluents and antioxidants at normal temperature to obtain a suspension; then the prepared suspension is extruded from the twin-screw extruder and injected into the metal mold, during this process, both the temperature of heating zone of twin-screw extruder and the temperature of the metal mold are strictly controlled; then, the mold is cooled in the aqueous medium and at last dried in the freeze dryer. Thus, the present disclosure, combining micro-injection technology with thermally induced phase separation method, provides a novel preparation method of a polyvinylidene fluoride/ultra-high molecular weight polyethylene blend microporous membrane, which has the composite surface structure composed of micro array structure and porous structure, and has good surface roughness, tensile strength and porosity, meanwhile, the hydrophobity, mechanical propertie and permeability are improved simultaneously.

Referring to FIG. 2, step S5 is included after step S4: using the polyvinylidene fluoride/ultra-high molecular weight polyethylene dry blend microporous membrane prepared in S4 as a substrate to perform a surface modification treatment on the substrate surface by magnetron sputtering technology.

In some embodiments, the magnetron sputtering technology is a radio frequency magnetron sputtering. By magnetron sputtering technology, the low surface energy nanoparticles were deposited on the surface of the dry microporous membrane using targets of low surface energy.

In some embodiments, the targets are low surface energy materials such as polytetrafluoroethylene, fluorinated ethylene propylene, polyvinylidene fluoride, graphite and the like; the sputtering power is 100-200 w, the sputtering time is 30 s-30 min, and the sputtering pressure is 0.1-1 Pa.

In the preparation method disclosed by the present disclosure, the dry microporous membrane is subjected to surface modification treatment by magnetron sputtering technology, and the nanoparticles of low surface energy are deposited on the surface of the dry microporous membrane. The nanoparticles deposite on the microarray structure of the microporous membrane to form a micro-nano composite structure while reducing the surface energy of the membrane. Further, the hydrophobicity of the membrane gets improved.

Figure 3:
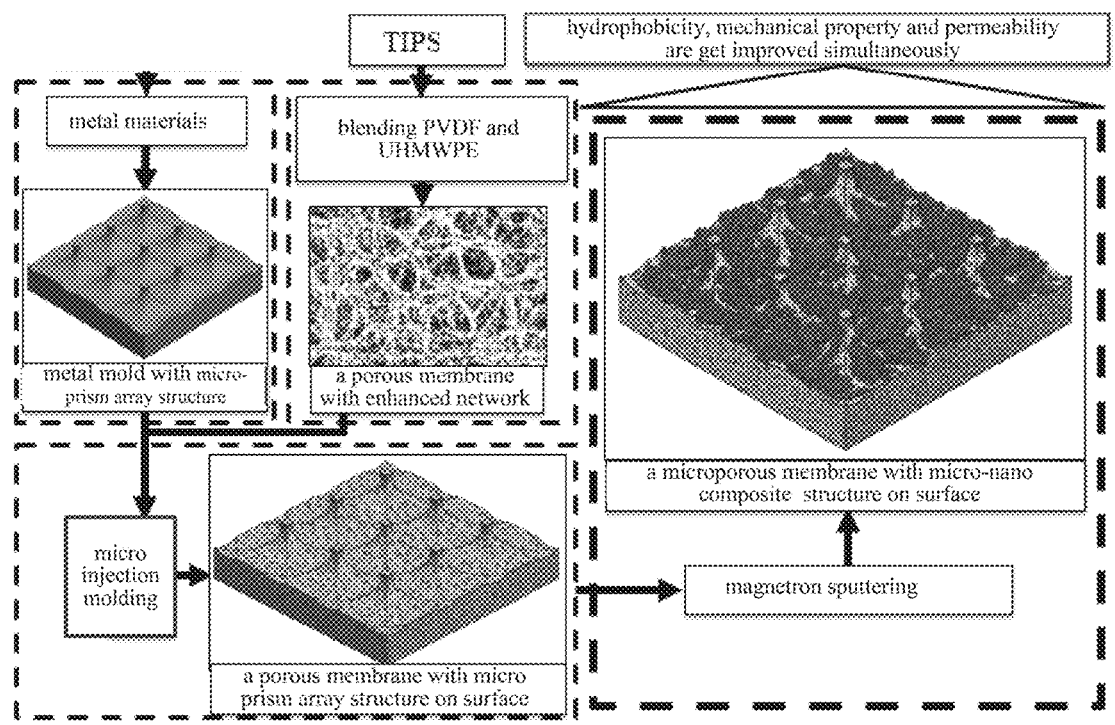
FIG. 3 shows a process route of the method for preparing a polyvinylidene fluoride/ultra-high molecular weight polyethylene blend microporous membrane according to an embodiment of the present disclosure.
Figure 4:
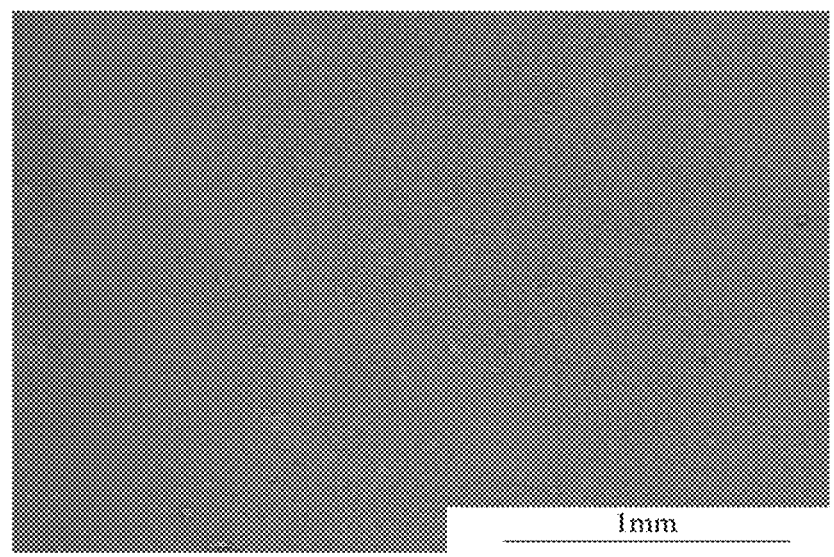
FIG. 4 is an electron microscope graph of the surface of the microporous membrane prepared in comparative example 1.

FIG. 3 illustrates the process route gragh of the polyvinylidene fluoride/ultra-high molecular weight polyethylene blend microporous membrane preparation method in the embodiment of the present disclosure. As shown in FIG. 3, the TIPS (thermally induced phase separation) method and the micro-injection molding are combined in the preparation method of the embodiments of the present disclosure, and a metal mold is adopted. The mold surface has a micro-prism array structure, and PVDF and UHMWPE are blended to obtain a porous membrane with enhanced network. By combining the TIPS method with the micro-injection molding, the porous membrane with micro-prism array on the surface is obtained preliminarily, and then the nanoparticles of low surface energy are deposited on the surface of the membrane through magnetron sputtering, so as to obtain a porous membrane with micro-nano composite structure. The surface of the microporous membrane has the micro-nano composite structure composed of porous structure, micron array structure and the nanoparticles of low surface energy; in the interior of the membrane, there is porous structure connected with network; the ultra-high molecular weight polyethylene enhances the connection in polyvinylidene fluoride crystals. Finally, the prepared microporous membrane has good hydrophobicity, mechanical property and permeability. According to the method, the process route is low in cost, strong in operability, convenient for industrial production.

The microporous membrane prepared by the embodiments of the present disclosure may have a thickness of 0.30-1.50 mm.

The blend microporous membranes and preparation method thereof of the embodiments of the present disclosure are further described below in conjunction with specific examples.

Comparative Example 1

1) The polyvinylidene fluoride is dried at 90° C. for 2 h.
2) 30 wt % of polyvinylidene fluoride and 70 wt % of dibutyl phthalate are stirred at normal temperature for 1 h to obtain a uniformly dispersed suspension.
3) The suspension prepared in step 2) is fed into the twin-screw extruder provided with 6 heating zones, wherein the temperature of each heating zone from 1 to 6 are, in order, 130° C., 140° C., 160° C., 175° C., 190° C., 200° C., the outlet temperature is 220° C., the rotation speed is 80 r/min; and the cast membrane gel extruded from the outlet is injected into a smooth mold at 220° C. for injection molding, and then cooled at 20° C. to obtain a nascent gel membrane.
4) The nascent gel membrane prepared in the step 3) is immersed in absolute ethanol for 24 h for a first extraction to remove the diluent dibutyl phthalate; finally, the membrane is placed in deionized water for 24 hours for a second extraction to remove absolute ethanol.
5) The membrane prepared by the step 4) is dried in freeze dryer to obtain a dry ultra-high molecular weight polyethylene/polyvinylidene fluoride microporous membrane.

The performance of the prepared microporous membrane is tested, and the results are shown in Table 1.

Example 1

1) The ultra-high molecular weight polyethylene is dried at 60° C. for 2 h, and the polyvinylidene fluoride is dried at 90° C. for 2 h.
2) 28 wt % polyvinylidene fluoride, 2 wt % ultra high molecular weight polyethylene, 0.2 wt % antioxidant, 29.8 wt % dibutyl phthalate and 40 wt % paraffin oil are stirred at room temperature for 1 h to obtain a uniformly dispersed suspension.
3) The suspension prepared in the step 2) is fed into a twin-screw extruder provided with 6 heating zones heated individually, wherein the temperature of each heating zone from 1 to 6 are, in order, 130° C., 140° C., 160° C., 175° C., 190° C., 200° C., the outlet temperature is 220° C., the rotation speed is 80 r/min. and the cast membrane gel extruded from the outlet is injected into the microstructure mold of 220° C. for injection molding, the cavity surface of the mold has micro-prism array structure, and the microstructure cycle size is 100 μm, and then cooled at 20° C., a nascent gel membrane is prepared.
4) The nascent gel membrane prepared in the step 3) is immersed in absolute ethanol for 24 hours for a first extraction to remove dibutyl phthalate; and placed in the 120# gasoline for 24 hours for a second extraction to remove paraffin oil and then placed in absolute ethanol for 12 h for a third extraction to remove 120# gasoline; finally, the membrane is placed in deionized water for 24 h for a fourth extraction to remove absolute ethanol.
5) The membrane extracted in the step 4) is dried in a freeze dryer to obtain a dry microporous membrane.

The performance of the microporous membrane prepared in the embodiment is tested, and the results are shown in Table 1.

Example 2

1) The ultra-high molecular weight polyethylene is dried at 60° C. for 2 h, and polyvinylidene fluoride is dried at 90° C. for 2 h.

2) 28 wt % polyvinylidene fluoride, 2 wt % ultra high molecular weight polyethylene, 0.2 wt % antioxidant, 29.8 wt % dibutyl phthalate and 40 wt % paraffin oil are stirred at room temperature for 1 h to obtain a uniform dispersion suspension.

3) The suspension prepared in the step 2) is fed into the twin-screw extruder with 6 heating zones, wherein the temperature of each heating zone from 1 to 6 are, in order, 130° C., 140° C., 160° C., 175° C., 190° C., 200° C., and the outlet temperature is 220° C., the rotation speed is 80 r/min. the cast membrane gel extruded from the outlet is injected into the microstructure mold of 220° C. for injection molding, the cavity surface of the mold has micro-prism array structure, and the microstructure cycle size is 100 μm, and then cool at 20° C., a nascent gel membrane is prepared.

4) The nascent gel membrane prepared in the step 3) is immersed in absolute ethanol for 24 hours for a first extraction to remove the dibutyl phthalate; and placed in the 120# gasoline for 24 h for a second extraction to remove paraffin oil and then placed in absolute ethanol for 12 h for a third extraction to remove 120# gasoline; finally, the membrane is placed in deionized water for 24 h for a fourth extraction to remove absolute ethanol.

5) The membrane extracted in the step 4) is dried in the freeze dryer to obtain a dry microporous membrane.

6) The dry microporous membrane obtained in the step 5) is taken as the substrate and graphite as the target, the graphite nanoparticles are deposited on the surface of the membrane by magnetron sputtering technology, thereby a hydrophobically modified polyvinylidene fluoride/ultrahigh molecular weight polyethylene microporous membrane is obtained, in which the sputtering pressure is 1 Pa, the sputtering power is 160 W, and the sputtering time is 3 min.

The performance of the microporous membrane prepared in the embodiment is tested, and the results are shown in Table 1.

Example 3

1) The ultra-high molecular weight polyethylene is dried at 60° C. for 2 h, and the polyvinylidene fluoride is dried at 90° C. for 2 h.

2) 28 wt % polyvinylidene fluoride, 2 wt % ultra high molecular weight polyethylene, 0.2 wt % antioxidant, 29.8 wt % dibutyl phthalate and 40 wt % paraffin oil are stirred at room temperature for 1 h to obtain a uniformly dispersed suspension.

3) The suspension prepared in the step 2) is fed into the twin-screw extruder, wherein the temperature of each heating zone from 1 to 6 are, in order, 130° C., 140° C., 160° C., 175° C., 190° C., 200° C., the outlet temperature is 240° C., the rotation speed is 80 r/min. and the cast membrane gel extruded from the outlet is injected into the microstructure mold of 240° C. for injection molding, the cavity surface of the mold has micro-prism array structure, and the microstructure cycle size is 50 μm, and then cooled at 20° C., a nascent gel membrane is prepared.

4) The nascent gel membrane prepared in the step 3) is immersed in absolute ethanol for 24 hours for a first extraction to remove dibutyl phthalate; and placed in the 120# gasoline for 24 hours for a second extraction to remove paraffin oil and then placed in absolute ethanol for 12 h for a third extraction to remove 120# gasoline; finally, the membrane is placed in deionized water for 24 h for a fourth extraction to remove absolute ethanol.

5) The membrane extracted in the step 4) is dried in freeze dryer to obtain a dry microporous membrane.

The performance of the microporous membrane prepared in the embodiment is tested, and the results are shown in Table 1.

Example 4

1) The ultra-high molecular weight polyethylene is dried at 60° C. for 2 h, and the polyvinylidene fluoride is dried at 90° C. for 2 h.

2) 28 wt % polyvinylidene fluoride, 2 wt % ultra high molecular weight polyethylene, 0.2 wt % antioxidant, 29.8 wt % dibutyl phthalate and 40 wt % paraffin oil are stirred at room temperature for 1 h to obtain a uniformly dispersed suspension.

3) The suspension prepared in the step 2) is fed into the twin-screw extruder, wherein the temperature of each heating zone from 1 to 6 are, in order, 130° C., 140° C., 160° C., 175° C., 190° C., 200° C., the outlet temperature is 240° C., the rotation speed is 80 r/min. and the cast membrane gel extruded from the outlet is injected into the microstructure mold of 240° C. for injection molding, the cavity surface of the mold has micro-prism array structure, and the microstructure cycle size is 200 μm, and then cooled at 20° C., a nascent gel membrane is prepared.

4) The nascent gel membrane prepared in the step 3) is immersed in absolute ethanol for 24 hours for a first extraction to remove dibutyl phthalate; and placed in the 120# gasoline for 24 hours for a second extraction to remove paraffin oil and then placed in absolute ethanol for 12 h for a third extraction to remove 120# gasoline; finally, the membrane is placed in deionized water for 24 h for a fourth extraction to remove absolute ethanol.

5) The membrane extracted in the step 4) is dried in freeze dryer to obtain a dry microporous membrane.

The performance of the microporous membrane prepared in the embodiment is tested, and the results are shown in Table 1.

TABLE 1 performance test results

| | Tensile Strength | Front Contact Angle | Porosity | Surface Roughness |
|---|---|---|---|---|
| Control group 1 | 0.82 MPa | 135.39° | 60.90% | 124 nm |
| Example 1 | 1.25 MPa | 137.42° | 73.65% | 178 nm |
| Example 2 | 1.28 MPa | 146.24° | 70.45% | 326 nm |
| Example 3 | 1.21 MPa | 142.36° | 67.79% | 223 nm |
| Example 4 | 1.23 MPa | 133.32° | 69.34% | 153 nm |

Figure 5:
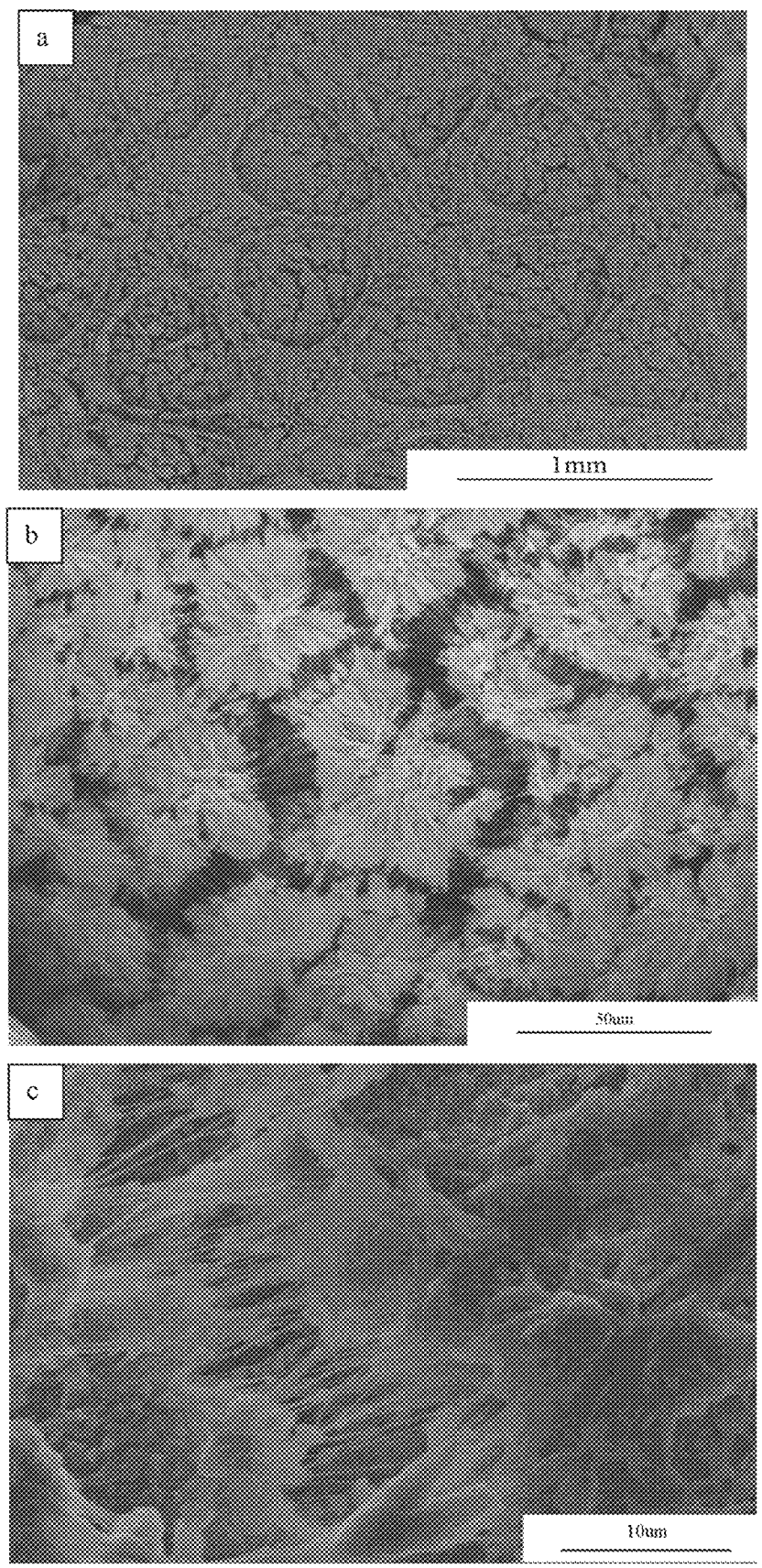
FIG. 5 is an electron microscope graph of the surface of the microporous membrane prepared in example 1.
Figure 6:
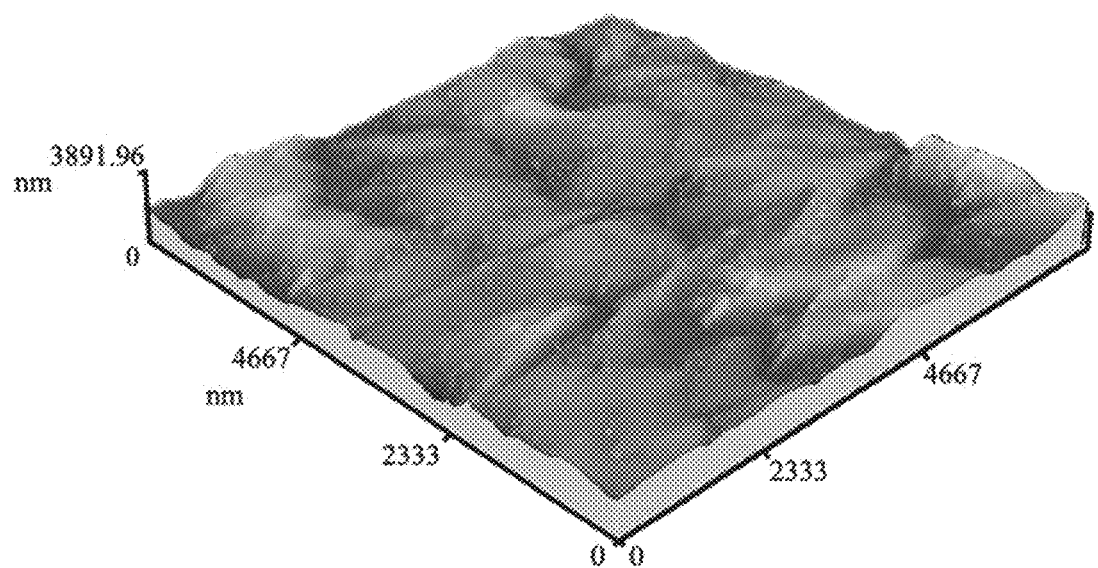
FIG. 6 is an atomic force microscopy three-dimensional graph of the surface of the microporous membrane prepared in example 1.

As is apparent from comparison of Examples 1-4 and Comparative Example 1, referring to FIG. 5a, the membrane surface has neat micron array structure. Referring to FIG. 5c, UHMWPE is present in the form of network connection in the membrane. Referring to Table 1, in Example 1, the contact angle reaches 137.42° while the tensile strength is still as high as 1.25 MPa (0.43 MPa higher than Comparative Example 1, 0.25 MPa higher than 1 MPa (conventional threshold). Compared with the prior art, the preparation method disclosed in the present disclosure combines thermal phase inducted method and micro-injection molding to prepare a blended membrane, which improves the hydrophobicity and mechanical strength at the same time.

Figure 7:
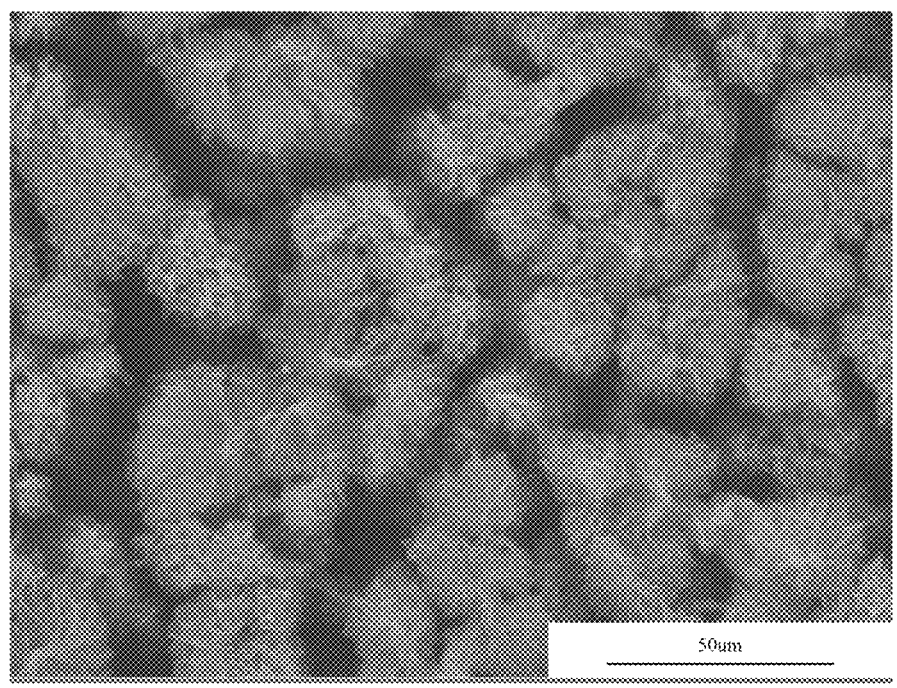
FIG. 7 is an electron microscope graph of the surface of the microporous membrane prepared in example 2.
Figure 8:
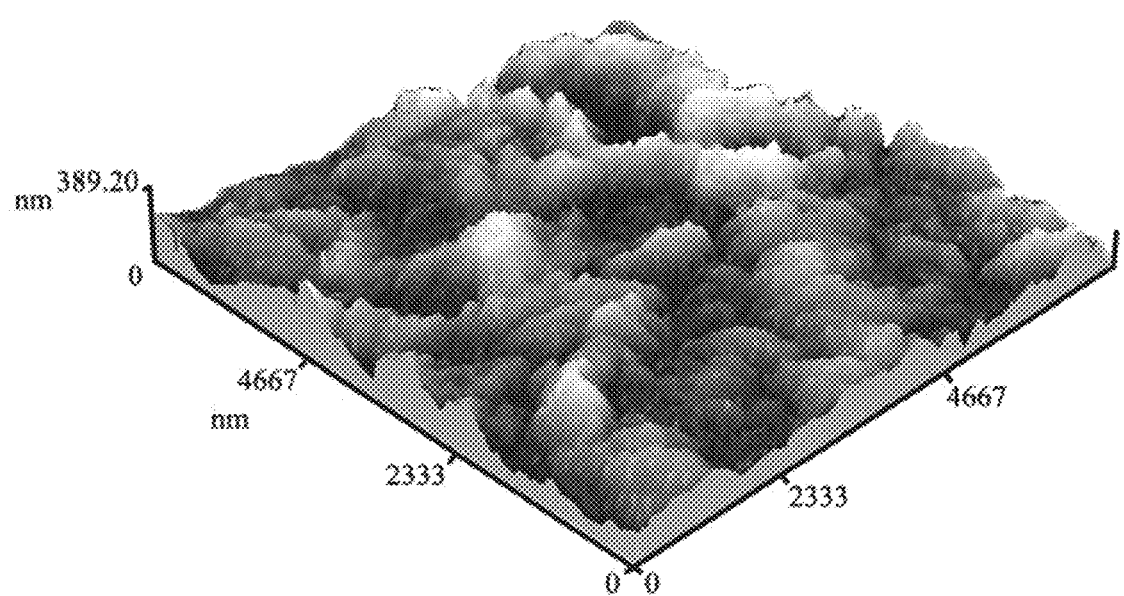
FIG. 8 is an atomic force microscopy three-dimensional graph of the surface of the microporous membrane prepared in example 2.

Compared with Examples 1 and 2, a layer of nanoparticles is deposited on the surface of the microporous membrane by magnetron sputtering (shown in FIG. 5b and FIG. 7), which effectively increases the roughness, the front contact angle and the hydrophobicity of the membrane.

Compared with Examples 3 and 4, it can be seen that the microstructure cycle size is reduced, and the roughness of the membrane surface is increased, which is favorable for increase of water contact angle of the membrane surface and hydrophobic of the membrane.

In the description of the present specification, the description of the terms "one embodiment", "some embodiments" and the like means that the specific features, structures, materials or characteristics described in connection with the embodiments or examples are included in at least one embodiment or example of the present disclosure. In the present specification, the schematic representation of the above terms does not necessarily refer to the same embodiment or example. Furthermore, the particular features, structures, materials, or characteristics described above may be combined in a suitable manner in any one or more embodiments or examples.

The above is only the specific embodiment of the present disclosure, but the scope of the present disclosure is not limited thereto, and the technical scope which any person skilled in the art can easily think of changes or substitutions should be covered in the scope of the present disclosure. Therefore, the scope of the present disclosure should be determined by the scope of the claims.

The invention claimed is:

1. A preparation method of a polyvinylidene fluoride/ultra-high molecular weight polyethylene blend microporous membrane, including the following steps:
    S1: drying ultra-high molecular weight polyethylene at 60° C. for 2-3 h, and polyvinylidene fluoride at 90° C. for 2-3 h;
    S2: mixing the polyvinylidene fluoride and the ultra-high molecular weight polyethylene prepared in S1 together with an antioxidant and a diluent system, then stirring for 1-2 h at room temperature to obtain a uniformly dispersed suspension;
    S3: feeding the suspension prepared in S2 into a twin-screw extruder with 6 heating zones heated individually, wherein the temperature of each heating zone from 1 to 6 are, in order, 130° C., 140° C., 160° C., 175° C., 190-220° C., 200-230° C., and the outlet temperature is 200-250° C.; and injecting the cast membrane gel extruded from the outlet directly into a metal mold for injection molding; wherein the mold temperature and the outlet temperature of the twin-screw extruder are the same, and the cavity surface of the mold has micro-prism array structure; and then cooling the mold with the cast membrane gel in aqueous medium of 0-100° C. to obtain a nascent gel membrane;
    S4: drying the nascent gel membrane prepared in S3 in a freeze dryer for more than 12 h after removal of the diluent by extraction, to obtain a polyvinylidene fluoride/ultra-high molecular weight polyethylene dry blend microporous membrane.

2. The preparation method according to claim 1, wherein, the microstructure cycle size of the micro-prism array structure is 20-200 μm.

3. The preparation method according to claim 1, wherein, step S5 is included after step S4: treating the dry blended microporous membrane prepared in S4 as a substrate to perform surface modification treatment on it by magnetron sputtering technology.

4. The preparation method according to claim 3, wherein, the magnetron sputtering technology is a radio frequency magnetron sputtering; a target is selected from polytetrafluoroethylene, fluorinated ethylene propylene, polyvinylidene fluoride or graphite; the sputtering power is 100-200 w, the sputtering time is 30 s-30 min and the sputtering pressure is 0.1-1 Pa.

5. The preparation method according to claim 1, wherein, the prepared blend microporous membrane has a thickness of 0.30-1.50 mm.

6. The preparation method according to claim 1, wherein, the diluent is a mixture of dibutyl phthalate and paraffinic oil;
    the nascent gel membrane prepared in S3 is subjected to four extractions before being dried in a freeze dryer including: a first extraction by immersing in absolute ethanol for 12-24 h; a second extraction by immersing in gasoline for 12-24 h; a third extraction by immersing in absolute ethanol for 6-12 h; and a fourth extraction by immersing in deionized water for 24-48 h.

7. The preparation method according to claim 1, wherein, the blend microporous membrane is prepared by the following components:

| | |
|---|---|
| polyvinylidene fluoride | 10.00-30.00 wt % |
| ultra-high molecular weight polyethylene | 0.50-10.00 wt % |
| paraffinic oil | 40 wt % |
| dibutyl phthalate | 19.00-49.45 wt % |
| antioxidant | 0.05-1.00 wt %; | the sum of the components is 100 wt %.

8. The preparation method according to claim 7, wherein, the antioxidant is beta-(3, 5-di-tert-butyl-4-hydroxy phenyl) propionic acid octadecanol ester and the mass ratio to ultra-high molecular weight polyethylene is 1:10.

9. The preparation method according to claim 1, wherein, taking the prepared blend microporous membrane as a separation membrane to conduct separation process in membrane separation.

10. The preparation method according to claim 9, wherein, the membrane separation is selected from membrane distillation, membrane extraction, or gas membrane separation.

11. The preparation method according to claim 1, wherein, the prepared blend microporous membrane has a composite surface of micro prism array structure and porous structure, and the porous structure comprises a pore structure formed after extraction of diluents and an interface pore structure formed between polyvinylidene fluoride and ultra-high molecular weight polyethylene.

12. A polyvinylidene fluoride/ultra-high molecular weight polyethylene blend microporous membrane prepared by the preparation method according to claim 1, wherein step S5 is included after step S4: using the dry blend microporous membrane prepared in S4 as a substrate to perform surface modification treatment on it by magnetron sputtering technology.

13. The blend microporous membrane according to claim 12, wherein the magnetron sputtering technology is a radio frequency magnetron sputtering; the target used above is selected from polytetrafluoroethylene, fluorinated ethylene propylene, polyvinylidene fluoride or graphite; the sputtering power is 100-200 w, the sputtering time is 30 s-30 min and the sputtering pressure is 0.1-1 Pa.

14. A polyvinylidene fluoride/ultra-high molecular weight polyethylene blend microporous membrane prepared by the preparation method according to claim 1, wherein the blend microporous membrane has a composite surface of micro prism array structure and porous structure, and the porous structure comprises a pore structure formed after extraction of diluents and an interface pore structure formed between polyvinylidene fluoride and ultra-high molecular weight polyethylene.

15. The preparation method according to claim 1, wherein, the microstructure cycle size of the micro-prism array structure is 50-100 μm.

\* \* \* \* \*